United States Patent
Iotov

(10) Patent No.: US 7,580,037 B1
(45) Date of Patent: Aug. 25, 2009

(54) TECHNIQUES FOR GRAPHICAL ANALYSIS AND MANIPULATION OF CIRCUIT TIMING REQUIREMENTS

(75) Inventor: Mihail Iotov, San Jose, CA (US)

(73) Assignee: Altera Corporation, San Jose, CA (US)

( * ) Notice: Subject to any disclaimer, the term of this patent is extended or adjusted under 35 U.S.C. 154(b) by 457 days.

(21) Appl. No.: 10/655,695

(22) Filed: Sep. 5, 2003

(51) Int. Cl.
*G06T 11/20* (2006.01)
*G01R 13/02* (2006.01)
*G01R 31/28* (2006.01)
*G06F 17/50* (2006.01)
*G06F 1/12* (2006.01)

(52) U.S. Cl. .................. 345/440; 702/67; 702/68; 703/19; 713/401; 714/46; 714/725

(58) Field of Classification Search ............. 345/440; 702/67, 68; 703/19; 713/401; 714/46, 725
See application file for complete search history.

(56) References Cited

U.S. PATENT DOCUMENTS

| | | | | |
|---|---|---|---|---|
| 6,466,898 B1 * | 10/2002 | Chan | .......................... | 703/17 |
| 6,530,065 B1 * | 3/2003 | McDonald et al. | ............. | 716/4 |
| 6,624,829 B1 * | 9/2003 | Beck et al. | .................. | 715/771 |
| 6,662,126 B2 * | 12/2003 | Liu et al. | ...................... | 702/69 |
| 6,675,310 B1 * | 1/2004 | Bloom et al. | ............... | 713/500 |
| 6,871,331 B1 * | 3/2005 | Bloom et al. | .................. | 716/4 |
| 6,898,771 B2 * | 5/2005 | Tojima et al. | ................. | 716/10 |
| 7,089,517 B2 * | 8/2006 | Yamoto et al. | ................. | 716/5 |
| 2002/0030683 A1 * | 3/2002 | Alexander | ............... | 345/440.1 |
| 2004/0216005 A1 * | 10/2004 | Pramanick et al. | ............ | 714/30 |

FOREIGN PATENT DOCUMENTS

JP          11195053 A    *    7/1999

OTHER PUBLICATIONS

"Introduction to Quartus® II," product manual, chapter 7, pp. 102-146, Altera Corporation San Jose, CA (2003).
"Optimizing FPGA Performance Using the Quartus II Software," Altera Application Note 297, version 1.1, Altera Corporation San Jose, CA (Jun. 2003).

(Continued)

*Primary Examiner*—Kee M Tung
*Assistant Examiner*—Daniel Washburn
(74) *Attorney, Agent, or Firm*—Townsend and Townsend and Crew LLP

(57) ABSTRACT

Techniques for organizing and displaying timing data derived from an EDA tool are provided that allows users to easily extract, analyze, and manipulate portions of the timing data relevant to particular user requirements. Relevant portions of signal waveforms are displayed on an interactive graphical user interface (GUI). Time points on the waveforms are marked with pointers so that users can easily visualize the relationships between different signals. A user can also extract relevant timing data from the EDA tool by manipulating the GUI. Manipulating and understanding circuit design requirements affects all of the design cycle and the quality of the final result from an EDA tool. A user can visualize all aspects of timing analysis on the GUI, such as clock skew, and the setup/hold relationship. A data entry approach is provided that can be used for natural and intuitive manipulation of various timing relationships.

12 Claims, 5 Drawing Sheets

OTHER PUBLICATIONS

"Optimizing MAX Designs Using the Quartus II Software," Altera Application Note 291, version 1.0, Altera Corporation San Jose, CA (Mar. 2003).

"Timing Closure with the Quartus II Software," Altera Application Note 198, version 1.2, Altera Corporation San Jose, CA (Jun. 2003).

"Using the Quartus II Chip Editor," Altera Application Note 310, version 1.0, Altera Corporation San Jose CA (Jun. 2003).

"Using Timing Analysis in the Quartus II Software," Altera Application Note 123, version 2.0, Altera Corporation San Jose, CA (Jan. 2001).

* cited by examiner

TECHNIQUES FOR GRAPHICAL ANALYSIS AND MANIPULATION OF CIRCUIT TIMING REQUIREMENTS

BACKGROUND OF THE INVENTION

The present invention relates to techniques for the graphical analysis and manipulation of circuit timing requirements, and more particularly, to techniques for graphically displaying waveforms for timing signals in a circuit analysis tool that allows users to more easily verify the proper operation of a circuit.

The proper operation of a circuit design can be verified by simulating the circuit design using an electronic design automation (EDA) tool such as PrimeTime from Synopsis. An EDA tool can test a circuit design to ensure that the circuit operates according to user specified constraints.

User constraints may include timing constraints. Timing constraints, for example, can include time limits for the propagation of signals between circuit elements. The time limits may be selected to ensure that the overall circuit design operates according to user requirements.

An EDA tool can test a circuit design and output data indicating timing delays between signals propagating through the circuit design. Quartus™ II is an example of a prior art EDA tool that is used to test programmable integrated circuits such as programmable logic devices. An EDA tool can test or analyze the proper timing operation of a circuit as part of its placement, routing and synthesis netlist manipulations as well.

All references herein to circuit simulation tools, or timing analysis tools, should be understood to include all tools that perform verification of the circuit design, by either, dynamic simulation of signal levels at all nets in the list, or static computation of propagation delays traversing paths on the netlist. This applies to verification tools and techniques used as part of netlist optimization, synthesis, placement and routing EDA tools in the overall EDA design processing flow.

Quartus™ II analyzes a circuit design and outputs timing data. The timing data can include information such as the duty cycle and period of clock signals used in the circuit design, the clock skew between a clock source and a circuit element in the circuit design, the offsets between each clock signal, and the time points that active edges in the clock signals occur. An active edge in a clock signal is a rising or falling edge that triggers a circuit function (e.g., causes a latch to capture an incoming signal). Quartus™ II displays the timing data output in text format.

Quartus™ II displays the timing data in a text format that is difficult for users to understand and apply. Quartus™ II does not output timing data in a way that clearly focuses on relationships between relevant portions of the signals.

Quartus™ II also does not allow a user to easily determine if he is analyzing a relevant portion of a signal, because Quartus™ II does not indicate what the relevant portions of the signals are. A user is often forced to perform complex hand calculations to determine the relevant timing information based on the timing data output by Quartus™ II.

Therefore, it would be desirable to provide techniques for organizing and displaying timing data from an EDA tool that allows users to easily extract, analyze, and manipulate relevant portions of the timing data.

BRIEF SUMMARY OF THE INVENTION

The present invention provides techniques for organizing and displaying timing data derived from an electronic design automation (EDA) tool. Systems and methods of the present invention organize and display timing data generated by an EDA tool in a graphical interactive user interface. A user can analyze and manipulate the graphical interactive user interface to change timing parameters that are used to generate the timing data.

Waveforms of signals propagating through a circuit design can be displayed on the interactive graphical user interface. Time points on the waveforms are marked on the graphical interface with pointers so that users can easily visualize the relationships between different signals.

Because the user interface of the present invention is interactive, users can easily extract relevant timing data and modify requirement parameters from the EDA tool by manipulating the graphical interactive user interface. For example, a user can move pointers to time points on the waveforms in the graphical user interface to change timing parameters relating to the signals. The present invention allows the user to clarify his requirements based on a better understanding of the circuit and how it operates.

After the timing parameters have been changed, an EDA tool can perform another simulation of the circuit design using the changed timing parameters to provide more accurate timing data. The waveforms displayed in the graphical user interface are then updated based on the more accurate timing data.

The techniques of the present invention allow users to more easily determine if circuit designs are operating according to specific requirements. Other objects, features, and advantages of the present invention will become apparent upon consideration of the following detailed description and the accompanying drawings, in which like reference designations represent like features throughout the figures.

DETAILED DESCRIPTION OF THE INVENTION

The present invention provides techniques for organizing and displaying timing data derived from an EDA tool. Timing data derived from an EDA tool is presented in an interactive graphical display format that can be easily read, understood, and edited by a user. Quartus™ II is an example of one commercially available EDA tool, although the present invention is not limited to any one specific EDA tool.

In one embodiment of the present invention, an interactive user interface displays waveforms of signals that are measured by the EDA tool during simulation of a circuit. The waveforms are displayed graphically. The user interface focus on portions of the waveforms that are relevant to verifying the proper operation of the circuit. The user can edit timing parameters displayed on the interface.

The techniques of the present invention can be used to display timing data from any type of circuit. For example, the present invention applies to simulations of an integrated circuit such as a programmable logic device (PLD), a field programmable gate array (FPGA), a programmable logic array (PLA), a configurable logic array, and an application specific integrated circuit (ASIC).

Figure 1A:
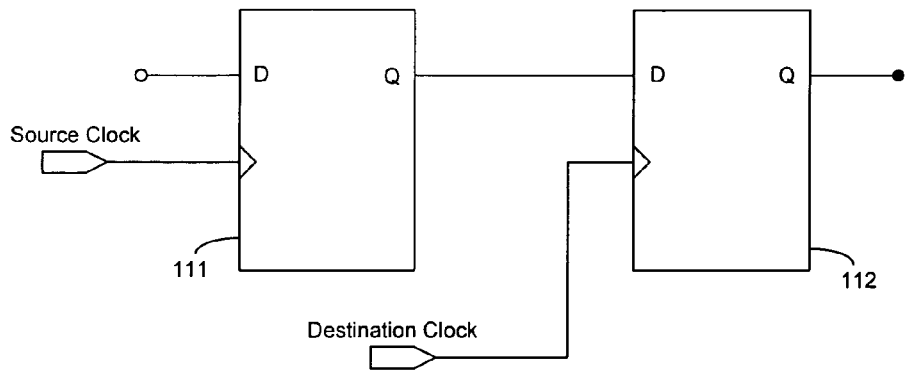
FIG. 1A is a diagram of two flip-flops that can be used to test timing requirements in accordance with the principles of the present invention.
Figure 1B:
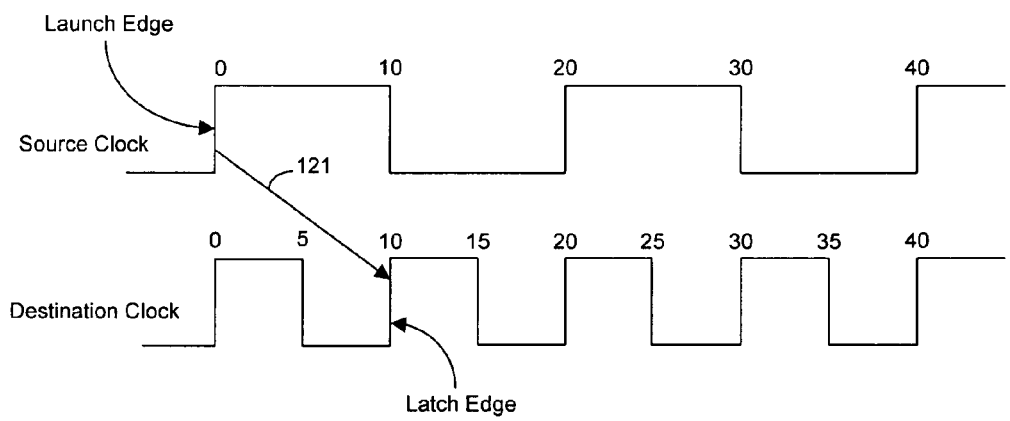
FIGS. 1B-1D illustrate waveforms of two clock signals that are used to control the flip-flops shown in FIG. 1A in accordance with the present invention.
Figure 1C:
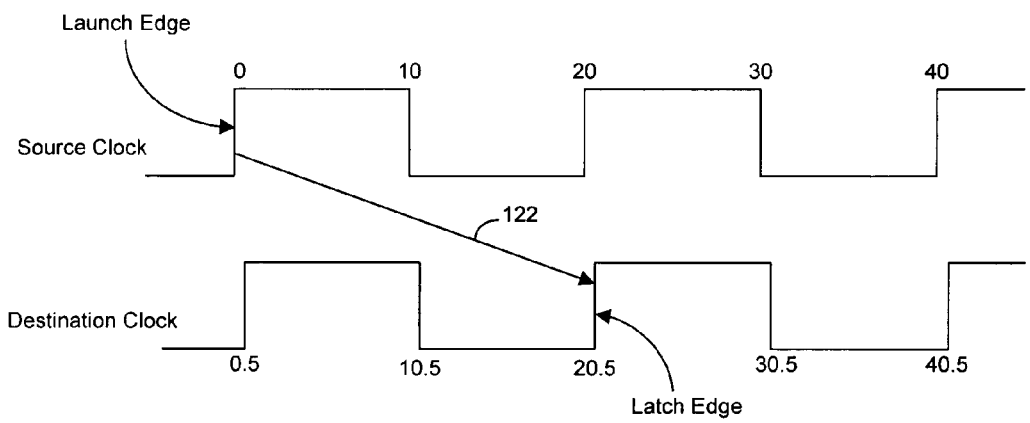
Figure 1D:
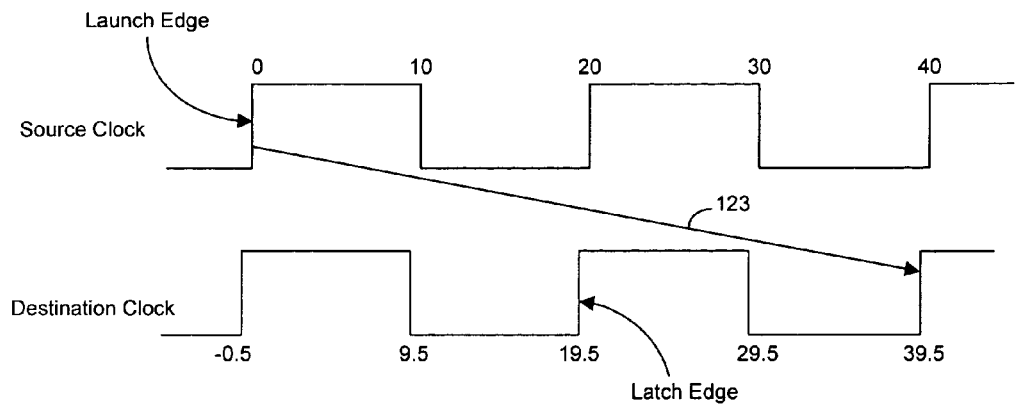

FIG. 1A illustrates an example of a circuit that can be analyzed according to the principles of the present invention. The circuit if FIG. 1A includes two D flip-flops 111 and 112 that are coupled together. Flip-flop 111 is controlled by clock signal Source Clock, and flip-flop 112 is controlled by clock signal Destination Clock. The output signal at the Q output of flip-flop 111 is fed into the D input of flip-flop 112. FIGS. 1B-1D illustrate examples of waveforms for digital clock signals Source Clock and Destination Clock. In the examples of FIGS. 1B-1D, time intervals are displayed in nanoseconds.

The first rising edge of Source Clock at time 0 in FIGS. 1B-1D is referred to as the launch edge. On the set launch edge of clock signal Source Clock, the signal at the D input of flip-flop 111 is passed to the Q output of flip-flop 111. The new signal at the Q output of flip-flop 111 starts propagating to the D input of flip-flop 112. Flip-flop 111 is referred to as the source latch, and flip-flop 112 is referred to as the destination latch. The discussion of flip-flops 111-112 is for illustrative purposes only. In the 'source latch' can be a memory (e.g. a RAM or a ROM) or any other circuit element that releases data upon a clock edge. The important event upon the launch edge is the release of data; in the case of ROM, no capture happens at the source latch. Also, the 'destination latch' can be a memory (e.g. RAM) or any other circuit element that captures data upon a clock edge.

The next rising edge of clock signal Destination Clock flip-flop 112 that occurs after the launch edge is referred to as the latch edge, as shown in FIG. 1B. On the latch edge, flip-flop 112 captures the incoming signal from flip-flop 111 by passing the signal at its D input to its Q output.

Although the present invention is discussed primarily in the context of timing analysis performed on signals passing between latches as shown in FIG. 1A, it should be understood that the principles of the present invention apply to timing analysis performed on any types of signals passing between any types of circuit elements in a circuit design.

Arrow 121 in FIG. 1B identifies the time period between the launch edge and the latch edge. The time period identified by arrow 121 indicates the time period between when flip-flop 111 releases a signal and when flip-flop 112 latches that same signal.

In some instances, destination latch 112 does not capture the incoming signal from source latch 111 on the first rising edge of Destination Clock that occurs after the launch edge. For example, in a programmable logic device, a substantial interconnect structure (wires, multiplexers, and logic gates or other combinatorial logic) may exist between latches 111 and 112. Destination latch 112 may not capture the incoming signal on the first rising edge of Destination Clock, if the incoming signal does not have enough time to propagate through the interconnect structure.

In the example shown in FIG. 1C, clock skew occurs between the clock source (e.g., a phase locked loop clock generator) of Destination Clock and destination latch 112. The clock skew delays Destination Clock by one-half a nanosecond (ns) with respect to Source Clock. In this example, one-half of a nanosecond is not enough time for a signal to propagate from latch 111 to latch 112. Therefore, latch 112 does not capture the incoming signal until the second rising edge of Destination Clock that occurs after the launch edge at 20.5 nanoseconds.

In the example of FIG. 1D, reduced clock skew between the clock source and destination latch 112 causes a rising edge of Destination Clock to occur one-half a nanosecond before the rising edge of Source Clock. Latch 112 captures the incoming signal on the first rising edge of Destination Clock that occurs after the launch edge at 19.5 nanosecond.

EDA tools such as Quartus™ II use a destination multi-cycle value that indicates when the latch edge occurs with respect to the launch edge. For example, a destination multi-cycle value of 1 indicates that the latch edge occurs on the first rising edge of Destination Clock that occurs after the launch edge. The destination multi-cycle parameters is often referred to as just the multi-cycle parameters or the setup multi-cycle parameter. The present invention also applies the source multi-cycle (setup) parameter, the destination multi-cycle hold parameter, and the source multi-cycle hold parameter, which are discussed below.

If the destination multi-cycle value is preset to 1, the EDA tool outputs timing data values based on the assumption that latch 112 captures the incoming signal from latch 111 on the first rising edge of Destination Clock that follows the launch edge. However, latch 112 may not capture the incoming signal until the second rising edge of Destination Clock, as in the example of FIG. 1C (or a subsequent rising edge of Destination Clock). In the FIG. 1C example, the timing data output by the EDA tool is incorrect, because the EDA tool assumes that latch 112 captures the signal at 0.5 ns. Arrow 122 in FIG. 1C represents the correct time interval between the launch edge and the latch edge.

Using another example, the destination multi-cycle value is 2, and latch 112 captures the incoming signal from latch 111 on the first rising edge of Destination Clock that follows the launch edge. In this example, the timing data output by the EDA tool is also incorrect.

FIG. 1D illustrates this example. The latch 112 captures the incoming signal at the latch edge (19.5 ns). However, the EDA tool outputs timing data based on the assumption that latch 112 does not receive the incoming signal until the second rising edge of Destination Clock following the launch edge (39.5 ns), as shown by arrow 123, because the multi-cycle value is preset to 2.

Each circuit element on an integrated circuit has a different clock skew value with respect to the clock source. Small variations in the clock skew (e.g., 0.5 ns) from an assumed value can cause the output data of an EDA tool to output incorrect data, as discussed above. The present invention solves this problem by allowing users to clearly see on a graphical interface the multi-cycle values the EDA tool has used. The graphical interface allows users to visually determine the accuracy of the multi-cycle value used by the EDA tool.

As discussed above, Quartus™ II outputs timing data from a circuit simulation as text in a format that is difficult to read and interpret. The timing data is not displayed in a format that allows users to easily determine whether the destination multi-cycle value is set to the correct number.

If Quartus™ II outputs timing data that indicates the circuit is not operating according to specifications, the cause of the incorrect timing data may be that the destination multi-cycle value is set to the wrong value as discussed above. On the other hand, the cause of the incorrect timing data may be a defect in the circuit design. Quartus™ II outputs numerous timing data values. Quartus™ II does not indicate how the timing data values are interrelated in a way that allows users to determine whether the destination multi-cycle values are correct. Time consuming calculations using the timing data output values are typically required to determine whether a destination multi-cycle value is correct. Verifying destination multi-cycle values for numerous circuit elements in a large circuit design is especially difficult and time consuming. Other common problems of circuit malfunctioning include clock skew and propagation delays that are too small or too large for data going from the Q output of register 111 to the D input of register 112. When data propagation delay is too small, the circuit operation violates a hold relationship requirement. The user can manipulate the hold relationship via source and destination hold multi-cycle parameters. In the present invention, the setup multi-cycle parameters are shown and discussed as one embodiment of the present invention. However, the present invention also applies to hold multi-cycle relationships and requirements. The hold multi-cycle parameters relate to defining the user requirements. For example, the hold time is typically 0 in a default state. The data delay and clock skew are set so that the hold requirement is satisfied. Generally, the hold requirement is satisfied if the clock skew minus the data delay is less than 0. Also, the data delay minus the clock skew should be less than the setup requirement, which is usually one clock period, in the default case. The default case occurs when the source and destination clocks have the same period and no multi-cycles have been entered. For both source and hold requirements, changing the multi-cycle to a value different than the default (i.e., 1) causes an additional value to be added to the requirement equal to the destination period for the destination multi-cycle and the source period for the source multi-cycle.

The present invention provides techniques for organizing and displaying the timing data output of an EDA tool such as Quartus™ II in a way that allows users to easily verify the operation of a circuit design. User interface 200 shown in FIG. 2 is an example of how the present invention provides timing data to a user in a format that is easy to read, understand, and edit.

User interface 200 graphically displays waveforms for four clock signals. User interface 200 displays clocks signals Source Clock and Destination Clock. Waveform 201 in FIG. 2 is the Source Clock signal at the clock source that generates Source Clock. Waveform 203 is the Source Clock signal at the clock input of a register (e.g., latch 111). Waveform 202 is the Destination Clock signal at the clock source that generates Destination Clock. Waveform 204 is the Destination Clock at the clock input of a register (e.g. latch 112).

Figure 2:
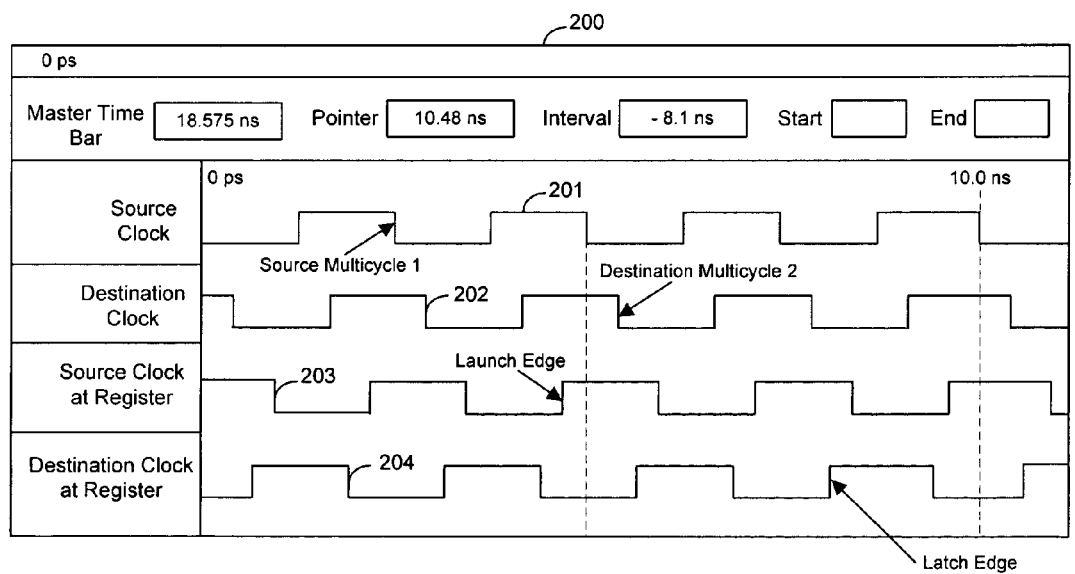
FIG. 2 illustrates a graphical interactive user interface that displays timing data of clock signals that has been derived from an EDA tool in accordance with the principles of the present invention.

As can be seen in FIG. 2, a significant clock skew is introduced into the Source Clock between the clock source and the register that receives Source Clock. A significant clock skew is also introduced into the Destination Clock between the clock source and the register that receives Destination Clock. This skew might be due to the nature of the digital circuit and the positional placement and routing of the circuit.

The clock skew in Source Clock and Destination Clock varies from register to register in a circuit design. The clock skew depends on the delay between the clock source and the register. The clock skew is significant in the timing analysis of a circuit design. By displaying waveforms that visually indicate the clock skew between the Source and Destination clock signals, the present invention reduces ambiguities in the output timing data of a circuit simulator tool as will now be discussed in further detail. The launch edge of Source Clock at the source register is identified on waveform 203 in FIG. 2. As discussed above, a launch edge on Source Clock at the register causes the source register (e.g., latch 111) to store the signal at its D input. The signal is then immediately released on the Q output for propagation to the destination. In the example of FIG. 2, an inversion occurs between the clock source of Source Clock and the source register. Therefore, a falling edge in Source Clock 201 at the clock source corresponds to the launch edge in waveform 203.

The source multi-cycle value of Source Clock is set to 1. This means that the first falling edge of Source Clock 201 after the start time (0 picoseconds) corresponds to the launch edge in clock 203. The launch edge in Source Clock at the clock source is identified as Source Multi-cycle 1 on waveform 201 in FIG. 2. The time delay between the Source multi-cycle 1 falling edge in waveform 201 and the launch edge in waveform 203 corresponds to the clock skew introduced into Source Clock between the clock source and the register.

Thus, in the example shown in FIG. 2, a falling edge is the active edge in Source Clock at the clock source, and a rising edge is the active edge in Source Clock at the register. In further embodiments of the present invention, the active edge for any clock signal may be a falling edge or a rising edge.

The latch edge of the Destination Clock at the destination register is identified on waveform 204 in FIG. 2. As discussed above, a latch edge on the Destination Clock 204 at the destination register causes the destination register (e.g., latch 112) to store the signal at its D input. The latch edge is a rising edge in waveform 204. However, the latch edge can also be a falling edge for latches that are active low.

An inversion occurs between the clock source of Destination Clock and the destination register. Therefore, a falling edge in Destination Clock 202 at the clock source corresponds to the latch edge in waveform 204.

The destination multi-cycle value of Destination Clock is set to 2. Therefore, the second falling edge of Destination Clock 202 that occurs after the Source Multi-cycle falling edge in waveform 201 corresponds to the latch edge in waveform 204. The latch edge in Destination Clock at the clock source is identified as Destination Multi-cycle 2 on waveform 202 in FIG. 2. The time delay between the Destination multi-cycle 2 falling edge in waveform 202 and the latch edge in waveform 204 corresponds to the clock skew introduced into Destination Clock between the clock source and the register.

As can be seen in interface 200, the latch edge in waveform 204 occurs two active rising edges after the launch edge in waveform 203. Therefore, the EDA tool used a destination multi-cycle value of 2. All four arrows shown in interface 200 are displayed to a user so that the user can clearly identify the active edges of the clock signals that trigger the registers (or other relevant circuit elements).

The present invention provides techniques for displaying the relationships between key timing signals that are important to a timing analysis of a circuit. A user can easily see which edges of the clock signals are the active edges that store data, because these edges are clearly labeled by pointers (arrows) in interface 200.

Also, the user can measure delays between the active edges in the clock signals, because the waveforms displayed in interface 200 are aligned with each other in time (i.e., in synchronism). The time delays between the clock active edges indicate the maximum available propagation time delay for a signal to pass from one circuit element (e.g., latch) to another, as discussed above.

Figure 3:
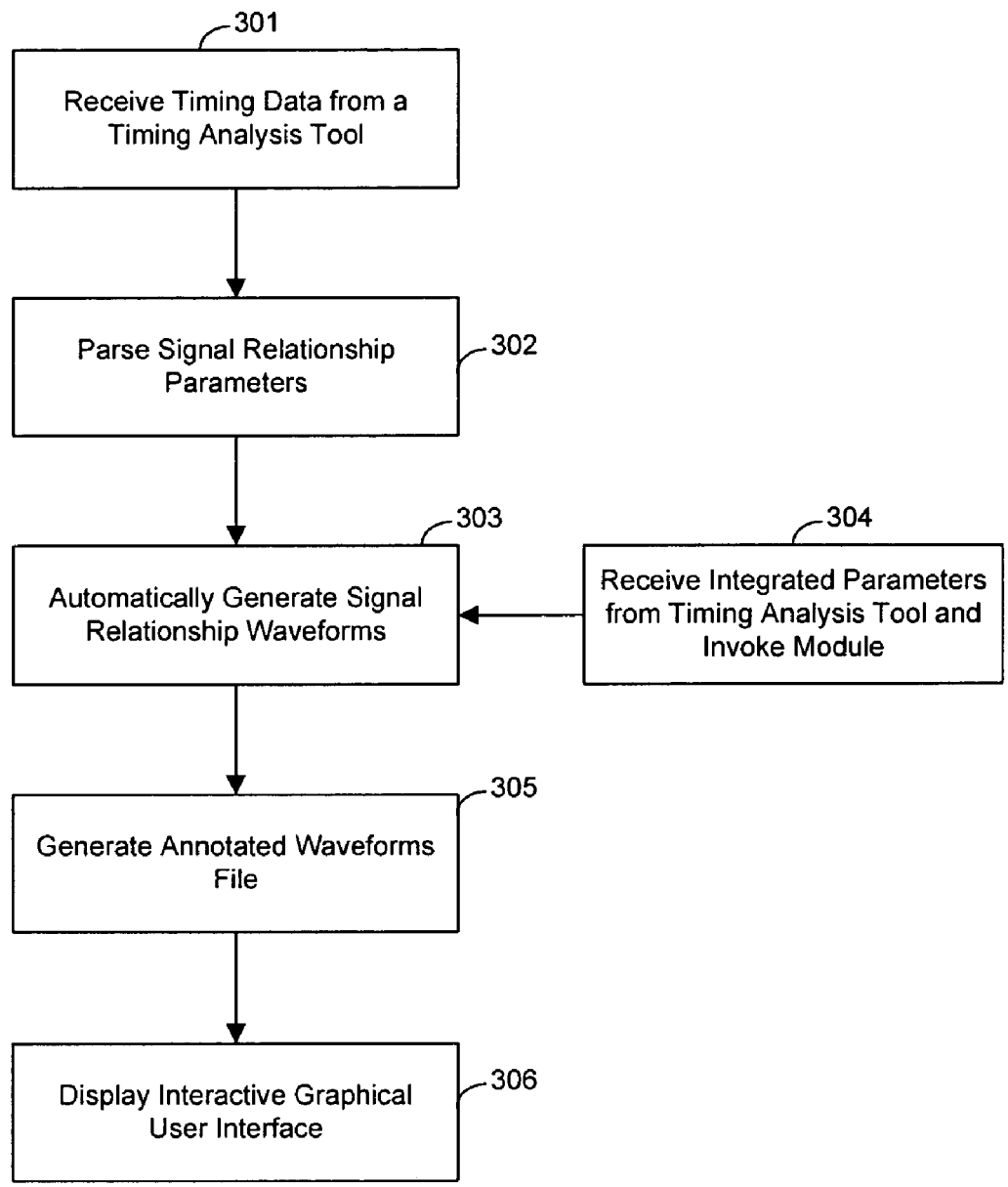
FIG. 3 is a flow chart that illustrates details of a process for generating a graphical interactive user interface for displaying timing data from an EDA tool in accordance with the present invention.

Further details regarding how systems and methods of the present invention generate an interactive graphical user interface such as interface 200 are now discussed in further detail with respect to FIG. 3. FIG. 3 is a flow chart that illustrates a process for generating a graphical interactive user interface displaying timing data from an EDA tool in accordance with the principles of the present invention.

At step 301, a system of the present invention receives timing data from a EDA tool such as Quartus™ II. The timing data is typically received as a text data file.

The timing data can include the clock periods and duty cycles of the Source Clock signals and the Destination Clock signals for the timing paths in the circuit design that are analyzed by the EDA tool. The timing data can also include the relative times of the launch edges and the relative times of the latch edges for registers analyzed by the tool.

The timing data can also include the clock skews of Source Clock and Destination Clock between the clock sources and each of the latches and other circuit elements that are analyzed by the tool. The present invention takes clock skew into account by shifting the clock signals by their respective clock skew values.

A user can select the signals that will be displayed on a interactive graphical user interface of the present invention. The selected signals may include control signals (e.g., clock signals) and/or data signals passing between the selected circuit elements. The user can also select which two registers are analyzed, out of the plurality of registers that comprise the digital circuit design.

A system of the present invention then generates waveforms for the selected signals in step 303. The present invention generates the waveforms using the timing data received from the EDA tool.

The present invention uses the clock skew information to determine the relationships between clock signals at circuit elements that are located in different portions of a chip. For example, clock skew can delay active edges of a clock signal at one circuit element by a different amount than at another circuit element. The present invention uses the clock skew information from the EDA tool to determine the relationship between the waveform for a clock signal at a clock source and the waveform for that same clock signal at a circuit element.

Other information needed to generate the relevant waveforms are derived from the EDA tool. For example, clock periods, active edges of the clock signals, and inversions in the clock signals are all derived from the EDA tool.

In step 302, the data is converted from text file representation to internal data representation. This internal data is used for the waveform data generated in step 303. Step 304 shows an alternative for data input, in an embodiment of the present invention that is embedded or integrated into an EDA tool (as in Quartus™ II). In this embodiment, the parameters are available in the tool and are just converted to the internal data representation.

At step 305, the present invention generates annotated waveform files. At step 306, the present invention displays an interactive graphical user interface to a user on a display screen. An example of an interactive graphical user interface is shown in FIG. 2.

The present invention can determine the portions of the relevant waveforms to display in the graphical user interface (e.g., interface 200) using a variety of techniques. A first embodiment is now discussed in detail. Each of the waveforms for the relevant signals are displayed across the same time interval. The start time for this time interval is selected by determining the earliest event of interest.

Using the example discussed with respect to FIG. 1, the earliest event of interest can be selected to be one full Source Clock period before the launch edge or one full Destination Clock period before the launch edge. The earliest event of interest is the earlier of these two points in time.

The end time for the time interval displayed in the graphical user interface is selected by determining the latest event of interest. The latest event of interest is selected to be one full Source Clock period after the launch edge or one full Destination Clock period before the latch edge. The latest event of interest is the later of these two points in time.

A second embodiment for determining the portions of the relevant waveforms to display in the graphical user interface is now discussed. According to the second embodiment, each of the waveforms for the relevant signals are displayed across a time interval that is a multiple of the periods of each displayed signal.

For example, if two clock signals are to be displayed in the user interface, the time interval displayed is selected to be a multiple M of the least common multiple of the periods (p1 and p2) of the two clock signals. Thus, the equation for the display interval is shown as follows:

$$M = \frac{p1 * p2}{GCD(p1, p2)} \quad (1)$$

In equation (1), GCD(p1, p2) refers to the greatest common divider of the periods p1 and p2 of the two clock signals. In this embodiment, the time interval displayed on the user interface is the period after the edges of the two clock signals align again and the relative pattern between the two signals starts repeating.

The second embodiment should be used if the user has not specified multi-cycle assignments for the relevant signals to be displayed in the user interface. The second embodiment can also be used if the multi-cycle assignments are made outside of the window computed via the first embodiment discussed above.

When an inverted clock signal is displayed in the user interface, the present invention adjusts the display of the original clock waveform as follows. The clock duty cycle DC expressed in % value between 0 and 100, is replaced with 100-DC, which is the original non-inverted clock duty cycle, and an offset (positive time shift) equal to the original high time is added to the clock signal.

For example, the clock signals can be displayed starting with the high time, so that the rising edges align at the center point of the display. High time refer to the time the clock is at the higher (1) value, as opposed to low-time when it is at the lower (0) value. For example on FIG. 1B, the source clock is high from 0 to 10 and low from 10 to 20. In this example, high and low times are the same—50% duty cycle, which is the ratio of the high time to the period. The period is the sum of high and low time.

A user can edit an interactive graphical user interface of the present invention to change certain timing parameters. For example, a user can change the launch edge or the latch edge of a clock signal. The present invention then provides the updated timing parameters received from the user back to the EDA tool. The EDA tool can then simulate the circuit design again using the updated timing parameters received from the user to provide more accurate output timing data.

The present invention then uses the more accurate output timing data to provide an updated interactive graphical user interface that displays updated waveforms. Usually, the user has a few iterations for design entry change, timing requirements adjustment, full design compile, where the EDA tool synthesizes, places and routes the design, possibly followed by simulation and timing verification.

The techniques of the present invention allow users to more easily determine if circuit designs are operating according to specific requirements. By providing a graphical interactive user interface that displays waveforms of signals in a circuit design, a user can determine what portions of the waveforms are relevant to the timing analysis of the circuit design. Manipulating and understanding circuit design requirements affects all of the design cycle and the quality of the final result from an EDA tool. Systems of the present invention can visualize all aspects of timing analysis, such as clock skew, and the setup/hold relationship. The present invention provides a data entry approach that can be used for natural and intuitive manipulation of some of clock, setup, and hold relationships.

Figure 4:
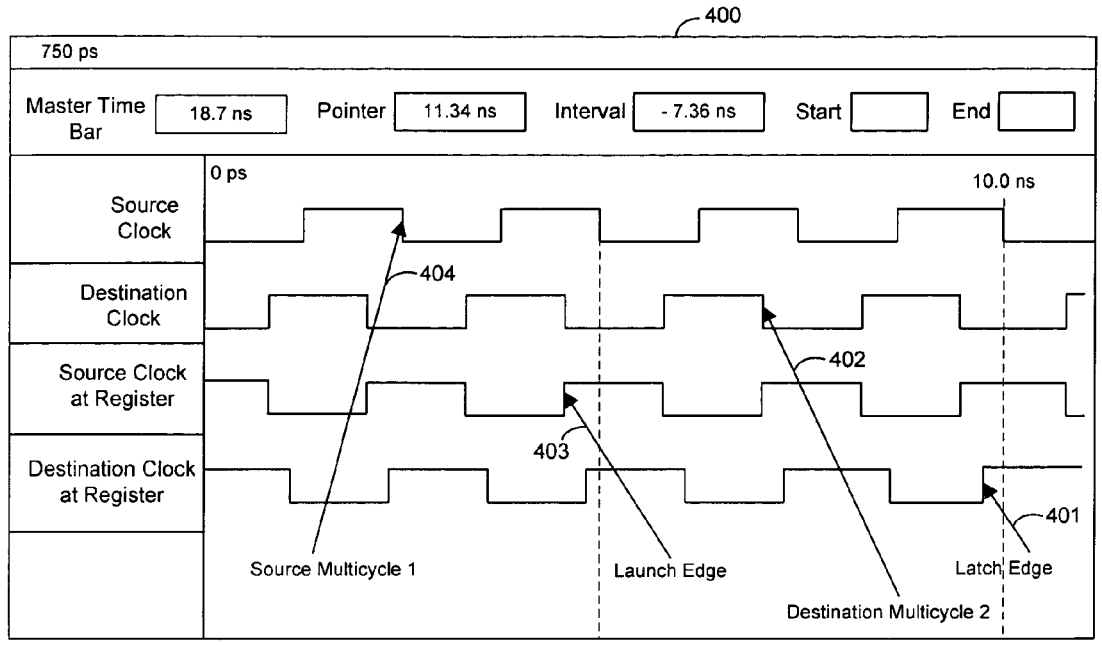
FIG. 4 illustrates another graphical interactive user interface that displays timing data of clock signals that that has been derived from an EDA tool in accordance with the principles of the present invention.
Figure 5:
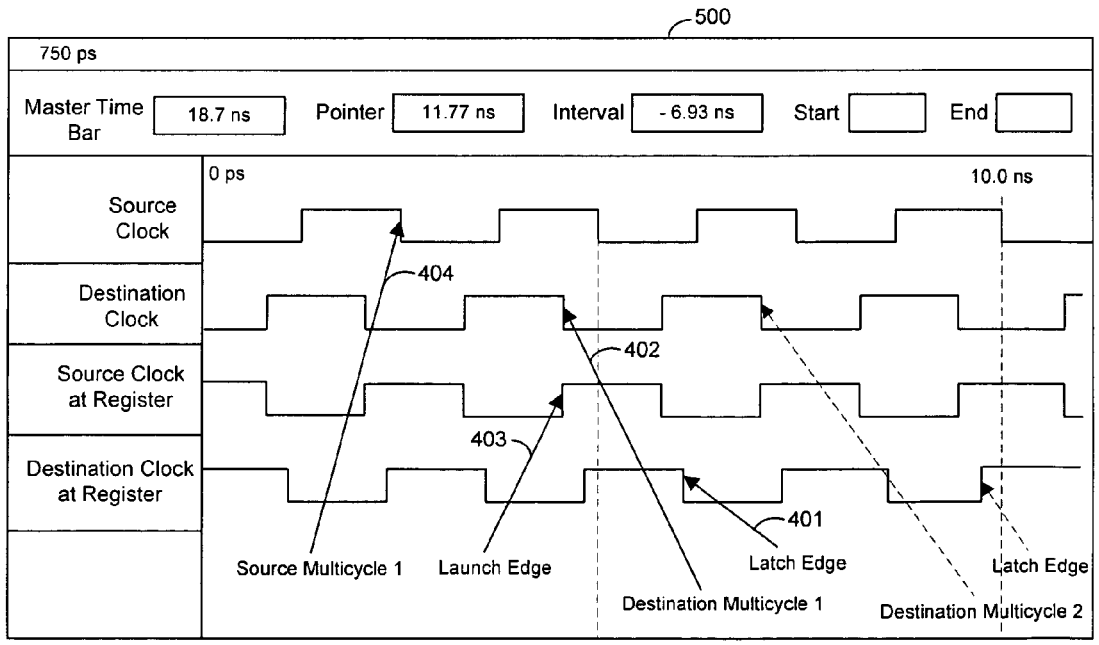
FIG. 5 illustrates the graphical user interface of FIG. 4 after it has been edited by a user in accordance with the principles of the present invention.

FIGS. 4 and 5 illustrates how a user can changes timing parameters for a EDA tool using an interactive graphical user interface of the present invention. In interface 400, the waveforms for four clocks are shown. The source multi-cycle, destination multi-cycle, launch edge, and latch edge are visually identified by arrow pointers 401-404, as discussed above with respect to FIG. 2.

Based on arrows 401-404 shown in FIG. 4, a user can visually determine whether the latch edge is set to be the correct edge of Destination Clock. In interface 400, the latch edge is set to be the third rising edge following the launch edge. If the latch edge should correspond to the first falling edge of Destination Clock following the launch edge, the EDA tool may output timing data that does not accurately predict the operation of the circuit design. The present invention allows a user to edit interface 400 to correct the error in the latch edge.

A user can change the clock edges that any of arrows 401-404 point to as shown, e.g., in interface 500 of FIG. 5. For example, a user can drag arrow 401 to the left as shown in interface 500. Arrow 401 identified the latch edge as the last rising edge of Destination Clock shown in interface 400. Subsequently, the user dragged arrow 401 to the left so that arrow 401 points to the first falling edge of Destination Clock at the register following the launch edge, as shown in interface 500.

As another example, a user can move arrow 402 that points to the Destination multi-cycle edge of the Destination Clock signal. In the example of FIG. 5, the user has dragged arrow 402 to the left to the previously occurring falling edge of the Destination Clock. After the user moves an arrow in the graphical user interface window, the present invention automatically updates the value for the changed timing parameter and sends the updated timing parameter to the EDA tool. The EDA tool then generates new timing data by simulating the circuit design using the updated value provided by the user. The new timing data can be used to update information displayed in interface 500 (or other output data of the EDA tool).

For example, if the user moves arrows 401 or 402 as shown in FIG. 5, the value for the destination multi-cycle is automatically updated from 2 to 1. The destination multi-cycle value is now 1, because the user has indicated that destination latch captures the incoming value on the first falling edge of Destination Clock at the register following the launch edge.

The user can move arrow 401 or 402 to indicate a change in the destination multi-cycle value. The present invention can automatically move the other arrow to correspond to the change made by the user.

For example, if the user moves arrow 402 as shown in interface 500, the present invention automatically moves arrow 401 as shown in FIG. 5. By moving arrow 402, the destination multi-cycle value is reset to 1 based on the first falling edge of Destination Clock that follows the source multi-cycle edge.

If the user wants to select a different edge as the latch edge, the user can move arrow 401 to another edge. For example, the user can move arrow 401 to the first falling edge follow the launch edge as shown in FIG. 5. If the user also moves arrow 402 to the falling edge as shown in FIG. 5, the present invention deletes the inversion in the Destination Clock signal at the register, because there is no longer an inversion in Destination Clock between the clock source and the register. The destination multi-cycle value in this example is still 1.

A user may want to move arrow 401, because the first rising edge in Destination Clock at the register occurs very soon after the launch edge. If a user knows that this is not enough time for a signal to propagate between the two registers, the user can move arrow 401 for the latch edge to the right in the interface.

On other hand, if arrow 401 points to a latch edge that is too far from the launch edge, a user can move arrow 401 to the left in the interface. The present invention is advantageous, because it allows user to easily determine that the latch edge and destination multi-cycle values are incorrect just by observing the timing relationships between the waveforms shown in interfaces 400 and 500.

According to further embodiments of the present invention, a user can edit the launch edge and source multi-cycle values simply by moving arrows 403 and 404 shown in FIG. 4. A user can increase the destination multi-cycle value by moving arrow 404 to the left or by moving arrow 402 to the right. A user can decrease the destination multi-cycle value by moving arrow 404 to the right or by moving arrow 402 to the left. A user can also change source or destination multi-cycle values by moving arrow 401 or arrow 403 in the appropriate direction.

A user can also add or delete an inversion between a clock signal at its source and the same clock signal at a circuit element. In one embodiment, moving arrow 401 to a falling edge causes the inversion in Destination Clock to be automatically deleted. In another embodiment, moving arrow 401 causes the present invention to automatically move arrow 402 to a correspond clock edge at the clock source. In the second embodiment, moving both arrows 401 and 402 deletes the inversion in Destination Clock.

According to still further embodiments, an interactive graphical user interface of the present invention can display data signals in addition to control signals. The interface can display arrows that point to relevant points on the data signals (e.g., when the data signals are received or captured by certain circuit elements). The interface also allows the user to move the arrows so that they point to different time points on the waveforms graphs.

The present invention provides techniques for allowing users to simulate circuit designs while dynamically updating timing parameters using an interactive graphical user interface. Because the present invention provides a graphical display of signal waveforms in a format that clearly shows the interrelationships between relevant signals, users can easily interpret the output data from an EDA tool. Again, entering the correct timing assignments affects the quality of the results produced at the end of the design cycle.

Users can select and change portions of the signal waveforms that are analyzed by the EDA tool. Thus, users can dynamically edit timing parameters to quickly determine whether the circuit design operates properly.

The present invention updates the timing parameters based on corrections made by a user through the interactive user interface. The present invention then sends the updated timing parameters back to the EDA tool to perform another simulation to produce new output timing data. The new output timing data is then used to generate new graphs for waveforms that the user desires to view.

It is understood that the present invention may be embodied in a computer program associated with an EDA tool and stored on a computer readable medium. The program when executed by a computer, analyzes and updates timing data generated by the EDA tool. The program includes code for using the timing data to generate signal and timing waveforms, code for displaying the waveforms and pointers to waveform points of interest in a window of an interactive graphical user interface, code for generating new timing parameters based on edits to the waveforms received from the user, code for updating the EDA tool with new timing parameters, and code for generating and displaying updated signal waveforms using updated timing data received from the EDA tool after the EDA tool generates the updated timing data by compiling, simulating and performing verification analysis using the new timing parameters.

Figure 6:
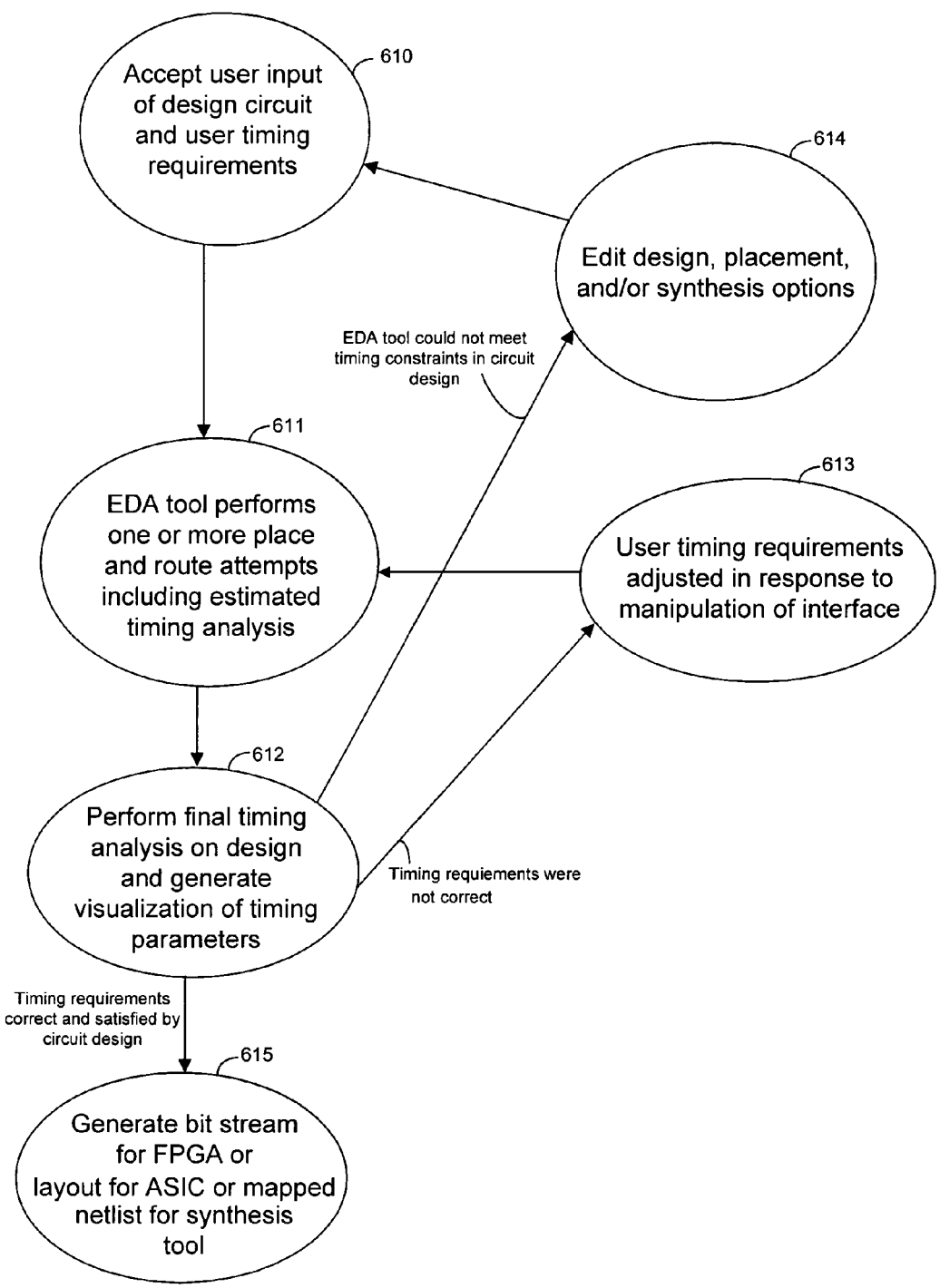
FIG. 6 is a flow chart that illustrates how a user edits timing requirements and circuit design/synthesis/placement options in response to visualizing timing data on a graphical user interface in accordance with the present invention.

FIG. 6 is a flow chart that illustrates how a user can edit timing requirements and circuit design/synthesis/placement options in response to visualizing timing data in accordance with the present invention. At step 610, the EDA tool accepts the user's input of the design circuit, which can be in the form of an HDL script, graphical entry, a C program, remotely over HTTP, Web services, from another client computer, or other human or machine interface. The user can also input timing requirements for the circuit design.

At step 611, the EDA tool attempts to place and route the circuit design on an PLD, FPGA, PLA, etc. according to well known principles. The EDA tool can make multiple attempts to place and route the circuit design if the tool has trouble getting good placement on the first attempt. The EDA tool generates estimated timing delay data, because the placement and routing is not final. Using these estimated delays, the EDA tool can determine whether a particular tentative place and route configuration satisfies the user's timing constraints, and if not, the EDA tool can attempt to place and route the circuit design again. Thus, the placement process is adaptive and is based on the preliminary timing delay estimates and timing analysis.

At step 612, the EDA tool performs a final timing analysis on the circuit design, based on precise delay modeling considering the final actual placement positions and routing of the circuit. Based on the final timing analysis, a visualization of timing parameters is displayed to the user according to the techniques of present invention. The visualization of the timing parameters can be in the form of an interactive graphical user interface displaying signal waveforms as discussed above, for example, with respect to FIGS. 4 and 5. If the user determines from the visualization of the timing parameters that the timing requirements entered for the circuit design are incorrect, the user can adjust the timing requirements at step 613. For example, the user can move pointers on an interactive interface as discussed above with respect to FIGS. 4 and 5. The software can automatically update the timing parameters based on the user's changes to the interactive interface.

After step 613, the EDA tool then attempts to place and route the circuit design again in step 611, because the quality of placement depends on the timing requirements and the timing analysis.

If the EDA tool cannot meet the user's timing requirements, the user is given an opportunity to edit the circuit design, synthesis, and/or placement options at step 614. For example, the user can change the circuit design itself or the constraints relating to how the circuit design is placed and synthesized. After step 614, the EDA tool accepts the user's changes at step 610 and repeats steps 611 and 612.

If the user determines the timing requirements are correct based on the visualization of the timing parameters, and the EDA tool can meet the user's timing requirements, the bit stream used to program the FPGA according to the circuit design is generated at step 615. Alternatively, a mapped netlist for a synthesis tool is generated at step 615 for the circuit design. For an ASIC, the layout of the ASIC design is generated at step 615.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for displaying and modifying timing data generated by an EDA tool used to simulate a circuit being designed, the method comprising:

receiving the timing data from the EDA tool, the timing data including at least multiple periods of a plurality of clock signals;

selecting first and second clock signals from the plurality of clock signals based on input received from a user;

generating a first waveform for the first selected clock signal and a second waveform for the second selected clock signal using the timing data;

generating a third waveform characterized as being a delayed replica of the first waveform and having transitions defining at least one launch edge;

generating a fourth waveform characterized as being a delayed replica of the second waveform and having transitions defining at least one latch edge;

selecting for display a portion of each of the first, second, third and fourth waveforms, the displayed portion of the third waveform comprising the at least one launch edge and the displayed portion of the fourth waveform comprising the at least one latch edge;

displaying pointers to time points of interest on the displayed waveform portions;

receiving edits to the time points of interest in response to a user moving the pointers on an interactive graphical user interface; and modifying the circuit so as to cause a change in relative timing of the at least one launch edge and the at least one latch edge based on the edits to the time points of interest.

2. The method of claim 1 wherein:

the time duration of the display of the first, second, third and fourth waveforms in a window of the interactive graphical user interface is a time period selected to be a multiple of the least common multiple of periods of the first clock signal and the second clock signal.

3. The method of claim 1 further comprising:
updating the timing data based on the edits to the time points of interest by inverting the launch edge of the first clock signal, either in a design file or as an input to a static timing verification tool.

4. The method of claim 1 further comprising:
updating the timing data based on the edits to the time points of interest by inverting the latch edge of the second clock signal.

5. A computer-readable medium encoded with a computer program, the computer program comprising a set of instructions for displaying and modifying timing data generated by an EDA tool used to simulate a circuit being designed, wherein the set of instructions when executed by a computer causes the computer to:
receive the timing data from the EDA tool, the timing data including at least multiple periods of a plurality of clock signals,
enable selection of first and second clock signals from the plurality of signals based on an input received from a user;
generate a first waveform for the first selected clock signal and a second waveform for the second selected clock signal using the timing data;
generate a third waveform characterized as being a delayed replica of the first waveform and having transitions defining at least one launch edge;
generate a fourth waveform characterized as being a delayed replica of the second waveform and having transitions defining at least one latch edge;
select for display a portion of each of the first, second, third, and fourth waveforms, the displayed portion of the third waveform comprising the at least one launch edge and the displayed portion of the fourth waveform comprising the at least one latch edge;
display pointers to time points of interest on the displayed waveform portions;
receive edits to the time points of interest in response to a user moving the pointers on an interactive graphical user interface; and
modify the circuit so as to cause a change in relative timing of the at least one launch edge and the at least one latch edge based on the edits to the time points of interest.

6. The computer-readable medium according to claim 5 wherein
the display of the portion of each of the waveforms in the interactive graphical user interface further comprises display of each of the portions of the waveforms in synchronism.

7. The computer-readable medium according to claim 5 wherein the display of the pointers to the time points of interest on the waveforms further comprises:
display of a first pointer to a launch edge of the third waveform that triggers a first latch to capture a data signal; and
display of a second pointer to a latch edge of the fourth waveform that triggers a second latch to capture the data signal.

8. The computer-readable medium according to claim 7 wherein the display of the pointers to the time points of interest on the waveforms further comprises:
display of a third pointer to an edge of the first waveform that corresponds to a source multi-cycle edge of the first waveform; and
display of a fourth pointer to an edge of the second waveform that corresponds to a destination multi-cycle edge of the second waveform.

9. The computer-readable medium according to claim 7 wherein the set of instructions when executed by the computer further causes the computer to generate
new timing data based on the edits to the time points of interest by changing a multi-cycle value that represents a number of active edges in the first clock signal from the launch edge to the latch edge in response to the user moving the first or the third pointer on the interactive graphical user interface.

10. The computer-readable medium according to claim 8 wherein the set of instructions when executed by the computer further causes the computer to generate
new timing data based on the edits to the time points of interest by changing a multi-cycle value that represents a number of active edges in the second clock signal from the launch edge to the latch edge in response to the user moving the second or the fourth pointer on the interactive graphical user interface.

11. The computer-readable medium according to claim 5 wherein the circuit design is a design for a field programmable gate array.

12. The computer readable medium according to claim 5 wherein the set of instructions when executed by the computer further causes the computer to generate updated waveforms for the signals using updated timing data, wherein the EDA tool generates the updated timing data by compiling, simulating and performing verification analysis on the circuit design based on the edits to the time points of interest and displays the updated waveforms in the interactive graphical user interface.

* * * * *

UNITED STATES PATENT AND TRADEMARK OFFICE
CERTIFICATE OF CORRECTION

PATENT NO. : 7,580,037 B1  Page 1 of 1
APPLICATION NO. : 10/655695
DATED : August 25, 2009
INVENTOR(S) : Mihail Iotov It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 866 days.

Signed and Sealed this

Fourteenth Day of September, 2010

David J. Kappos
*Director of the United States Patent and Trademark Office*